(12) United States Patent
Li et al.

(10) Patent No.: US 9,859,113 B2
(45) Date of Patent: Jan. 2, 2018

(54) STRUCTURE AND METHOD OF SEMICONDUCTOR DEVICE STRUCTURE WITH GATE

(71) Applicant: Taiwan Semiconductor Manufacturing Co., Ltd., Hsin-Chu (TW)

(72) Inventors: Jing-Yang Li, Hsinchu (TW); Chun-Sheng Wu, Hsinchu (TW); Ding-I Liu, Hsinchu (TW); Yi-Fang Li, Hemei Township, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/689,647

(22) Filed: Apr. 17, 2015

(65) Prior Publication Data

US 2016/0307758 A1    Oct. 20, 2016

(51) Int. Cl.
| | |
|---|---|
| H01L 21/28 | (2006.01) |
| H01L 21/02 | (2006.01) |
| H01L 29/66 | (2006.01) |
| H01L 29/78 | (2006.01) |
| H01L 29/423 | (2006.01) |

(Continued)

(52) U.S. Cl.
CPC .... *H01L 21/02274* (2013.01); *H01L 21/0217* (2013.01); *H01L 21/02164* (2013.01); *H01L 21/02167* (2013.01); *H01L 21/02271* (2013.01); *H01L 21/28247* (2013.01); *H01L 21/28518* (2013.01); *H01L 21/76814* (2013.01); *H01L 21/76831* (2013.01); *H01L 21/76897* (2013.01); *H01L 29/6656* (2013.01);

(Continued)

(58) Field of Classification Search
USPC ........................................... 257/288; 438/585
See application file for complete search history.

(56) References Cited

U.S. PATENT DOCUMENTS 7,214,990 B1 *  5/2007  Lee ..................... H01L 27/016
                                                          257/368
7,868,317 B2   1/2011  Yu et al.
(Continued)

OTHER PUBLICATIONS

Deposition Techniques, Professor N Cheung, Lecture 13, EE 143F 2010.*

*Primary Examiner* — Marcos D Pizarro
*Assistant Examiner* — Lawrence Tynes, Jr.
(74) *Attorney, Agent, or Firm* — Birch, Stewart, Kolasch & Birch, LLP

(57) ABSTRACT

A semiconductor device structure is provided. The semiconductor device structure includes a semiconductor substrate. The semiconductor device structure includes a gate stack over the semiconductor substrate. The semiconductor device structure includes spacers over opposite sidewalls of the gate stack. The spacers and the gate stack surround a recess over the gate stack. The semiconductor device structure includes a first insulating layer over the gate stack and an inner wall of the recess. The semiconductor device structure includes a second insulating layer over the first insulating layer. Materials of the first insulating layer and the second insulating layer are different, and a first thickness of the first insulating layer is less than a second thickness of the second insulating layer.

20 Claims, 9 Drawing Sheets

(51) Int. Cl.
 *H01L 21/768* (2006.01)
 *H01L 21/285* (2006.01)

(52) U.S. Cl.
 CPC .. *H01L 29/66545* (2013.01); *H01L 29/66628* (2013.01); *H01L 29/66636* (2013.01); *H01L 29/7848* (2013.01)

(56) References Cited

U.S. PATENT DOCUMENTS

| | | |
|---|---|---|
| 8,383,485 B2 | 2/2013 | Wang |
| 9,034,703 B2 * | 5/2015 | Cheng ............... H01L 21/28079 438/197 |
| 2009/0095990 A1 * | 4/2009 | Yang .................. H01L 29/4238 257/288 |
| 2014/0070333 A1 * | 3/2014 | Cheng ............... H01L 21/28079 257/411 |
| 2014/0273386 A1 * | 9/2014 | Tsao ..................... H01L 29/665 438/301 |
| 2015/0325690 A1 * | 11/2015 | Liu .................... H01L 21/3105 257/288 |

\* cited by examiner

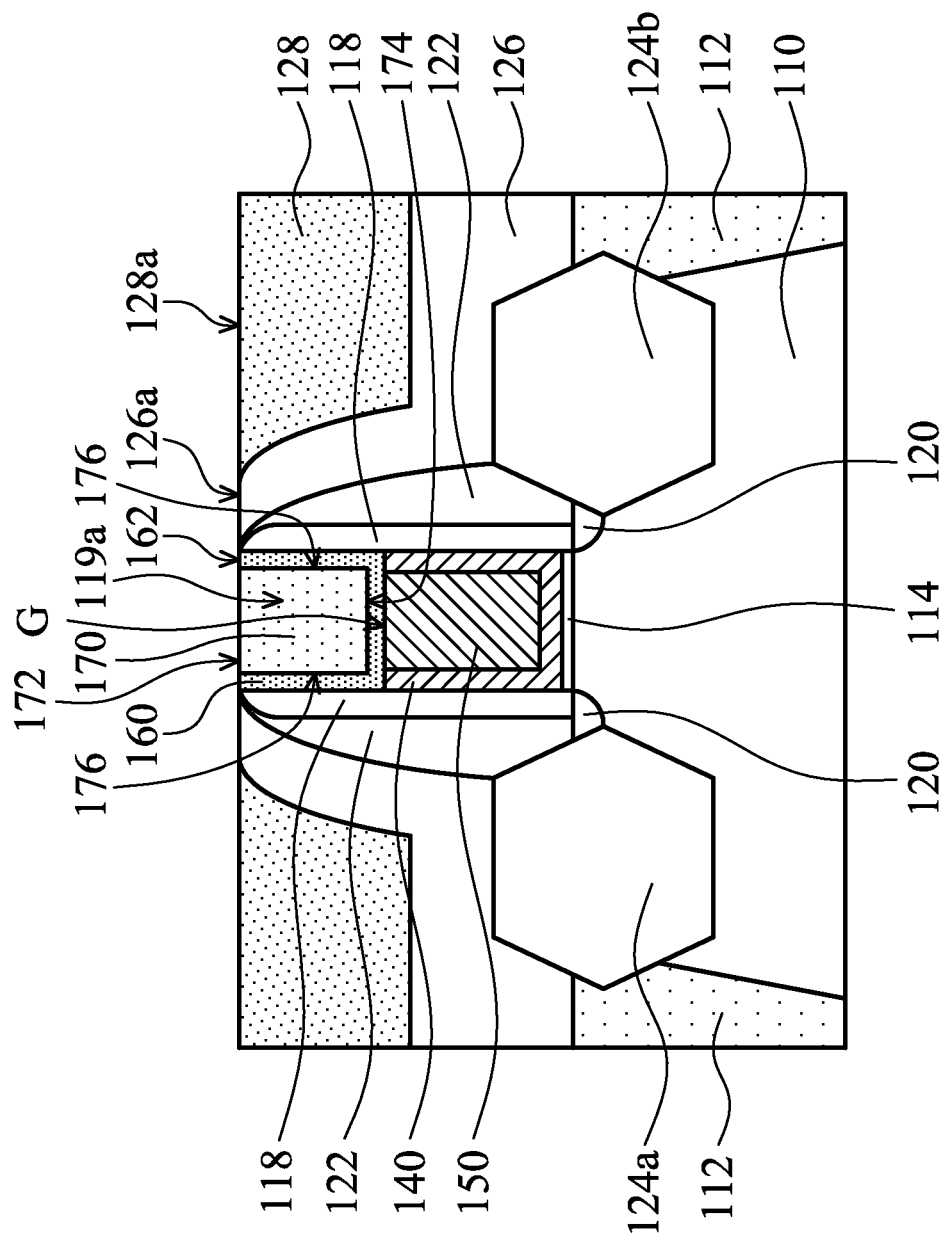

STRUCTURE AND METHOD OF SEMICONDUCTOR DEVICE STRUCTURE WITH GATE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1L are cross-sectional views of various stages of a process for forming a semiconductor device structure, in accordance with some embodiments.

DETAILED DESCRIPTION

Figure 1A:
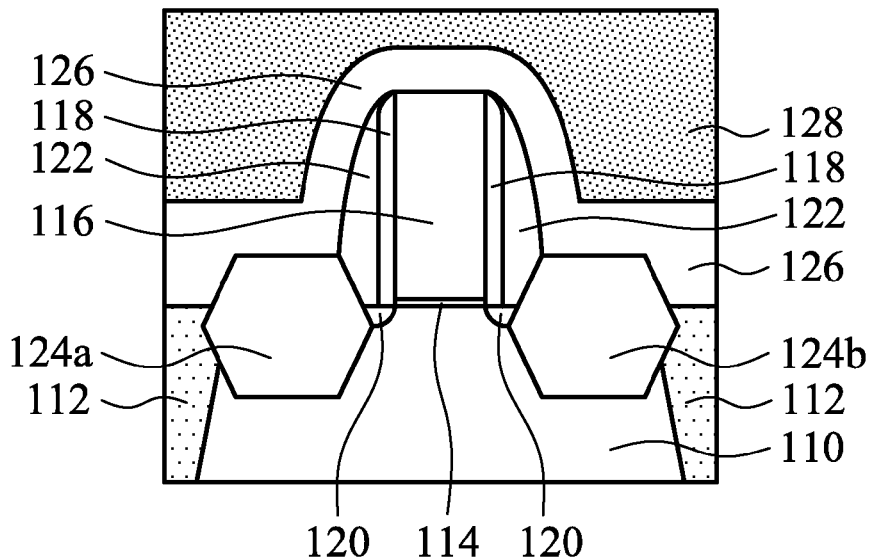

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1L are cross-sectional views of various stages of a process for forming a semiconductor device structure 100, in accordance with some embodiments. As shown in FIG. 1A, a semiconductor substrate 110 is provided. The semiconductor substrate 110 may be a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor, such as silicon carbide, gallium arsenide, gallium phosphide, indium phosphide, indium arsenide, an alloy semiconductor, such as SiGe, or GaAsP, or a combination thereof. In some embodiments, the semiconductor substrate 110 includes multi-layer semiconductors, semiconductor on insulator (SOI) (such as silicon on insulator or germanium on insulator), or a combination thereof.

As shown in FIG. 1A, an isolation structure 112 is formed in the semiconductor substrate 110 to define various active regions in the semiconductor substrate 110, in accordance with some embodiments. The isolation structure 112 is used to electrically isolate neighboring devices (e.g. transistors) from one another.

In some embodiments, the isolation structure 112 is made of a dielectric material, such as silicon oxide, silicon nitride, silicon oxynitride, fluoride-doped silicate glass (FSG), a low-K dielectric material, other suitable materials, or a combination thereof. In some embodiments, the isolation structure 112 is formed by using an isolation technology, such as local oxidation of semiconductor (LOCOS), shallow trench isolation (STI), or the like.

In some embodiments, the formation of the isolation structure 112 includes patterning the semiconductor substrate 110 by a photolithography process and an etching process to form a trench in the semiconductor substrate 110 (for example, by using a dry etching, wet etching, plasma etching process, or a combination thereof), and filling the trench (for example, by using a chemical vapor deposition process) with the dielectric material. In some embodiments, the filled trench has a multi-layer structure, such as a thermal oxide liner layer filled with silicon nitride or silicon oxide. However, in some embodiments, the isolation structure 112 is not formed.

As shown in FIG. 1A, a gate dielectric layer 114 and a dummy gate 116 are formed over the semiconductor substrate 110, in accordance with some embodiments. A gate-last approach or replacement-gate (RPG) approach will be subsequently performed to form a metal gate. The dummy gate 116 may be made of polysilicon.

In some embodiments, the gate dielectric layer 114 is made of, for example, a high dielectric constant (high-k) material. The high-k material is made of, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof.

The high-k material is made of, for example, metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof.

The gate dielectric layer 114 is deposited using any suitable process, such as atomic layer deposition (ALD), chemical vapor deposition (CVD), physical vapor deposition (PVD), sputtering, plating, another suitable process, or a combination thereof. In some embodiments, the gate dielectric layer 114 is further annealed.

An intermediate dielectric layer (not shown) may be formed over the semiconductor substrate 110 before the gate dielectric layer 114 is formed. The intermediate dielectric layer may be made of a suitable dielectric material, such as silicon oxide, hafnium silicate, silicon oxynitride, or a combination thereof.

As shown in FIG. 1A, a sealing layer 118 is formed over sidewalls of the dummy gate 116 and the gate dielectric layer 114, in accordance with some embodiments. The sealing layer 118 is configured to protect the gate dielectric layer 114 and the dummy gate 116 from damage during subsequent processes, in accordance with some embodiments.

The sealing layer 118 includes a dielectric material such as silicon nitride (SiNx), silicon oxide (SiOx), silicon oxynitride (SiON), carbon silicon oxynitride (SiOCN), silicon carbide (SiC), other suitable materials, or a combination thereof. The sealing layer 118 is formed by a deposition process (such as a chemical vapor deposition process) and an etching process, in accordance with some embodiments.

As shown in FIG. 1A, doped regions 120 are formed in the semiconductor substrate 110 and near two opposite sides of the dummy gate 116, in accordance with some embodiments. The doped regions 120 are a lightly doped source region and a lightly doped drain region, which are formed after the sealing layers 118 are formed, in accordance with some embodiments. The doped regions 120 are formed by using a suitable process, such as an ion implantation process.

As shown in FIG. 1A, spacers 122 are formed over the sealing layers 118, in accordance with some embodiments. The spacers 122 are made of a dielectric material, such as silicon nitride, silicon oxynitride, or a combination thereof, in accordance with some embodiments. The spacers 122 are formed over opposite sides of the dummy gate 116, in accordance with some embodiments. The spacers 122 are formed by a deposition process (such as a chemical vapor deposition process) and an etching process, in accordance with some embodiments.

As shown in FIG. 1A, a source stressor region 124a and a drain stressor region 124b are formed in the semiconductor substrate 110, in accordance with some embodiments. The source stressor region 124a and the drain stressor region 124b are adjacent to the spacers 122, in accordance with some embodiments. In some embodiments, the source stressor region 124a and the drain stressor region 124b are formed using an etching process for removing a portion of the semiconductor substrate 110 and a selective epitaxial growth (SEG) process.

The source stressor region 124a and the drain stressor region 124b are also referred to as a source region and a drain region. The source stressor region 124a and the drain stressor region 124b include SiGe, SiC or another suitable material, in accordance with some embodiments. In some embodiments, the source stressor region 124a and the drain stressor region 124b are used to provide strain or stress to the channel region under the gate dielectric layer 114 so as to increase the carrier mobility.

In some embodiments, the source stressor region 124a and the drain stressor region 124b are simultaneously doped during their growth or formation. Alternatively, a subsequent implantation process is performed to dope the source stressor region 124a and the drain stressor region 124b. In some other embodiments (not shown), the source stressor region 124a and the drain stressor region 124b are not formed.

A contact etch stop layer 126 is formed over the semiconductor substrate 110, the source stressor region 124a, the drain stressor region 124b and the dummy gate 116, in accordance with some embodiments. The contact etch stop layer 126 is also formed over the sealing layers 118 and the spacers 122, in accordance with some embodiments. The contact etch stop layer 126 is made of a dielectric material, such as silicon nitride, in accordance with some embodiments. However, in some other embodiments, the contact etch stop layer 126 is not formed.

As shown in FIG. 1A, a dielectric layer 128 is then deposited over the semiconductor substrate 110, in accordance with some embodiments. The dielectric layer 128 are made of a suitable dielectric material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. In some embodiments, the dielectric layer 128 is deposited by using a CVD process, HDPCVD process, spin-on process, sputtering process, another applicable process, or a combination thereof.

Figure 1B:
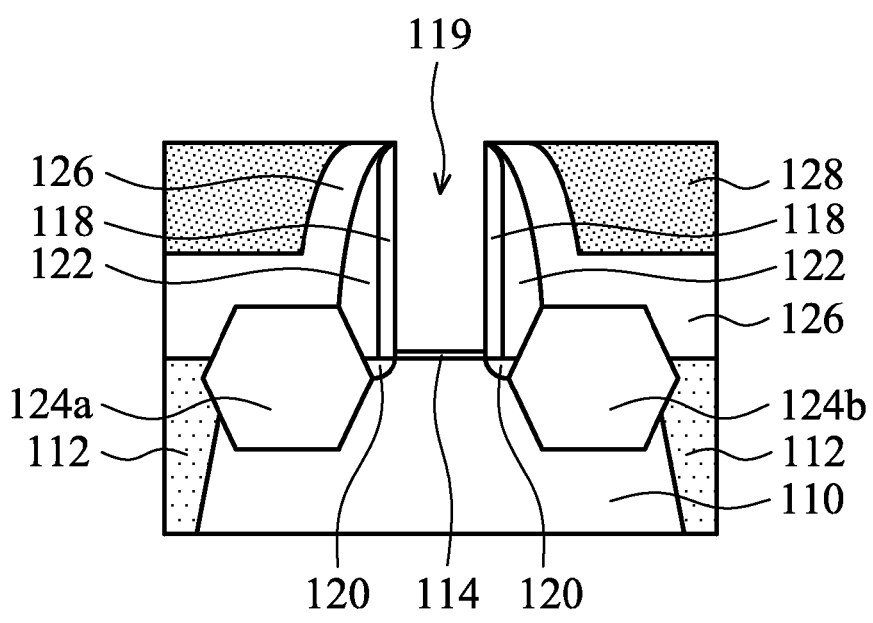

Afterwards, as shown in FIG. 1B, a planarization process is performed on the dielectric layer 128 until a top surface of the dummy gate 116 is exposed. The planarization process includes, for example, a chemical mechanical polishing (CMP) process or the like. After the planarization process is performed, the dielectric layer 128 has a substantially planar surface to facilitate subsequent process operations. The dielectric layer 128 surrounds the spacers 122, in accordance with some embodiments.

Afterwards, as shown in FIG. 1B, the dummy gate 116 is removed, in accordance with some embodiments. The dummy gate 116 is removed by using, for example, a wet etching process, a dry etching process, or a combination thereof. After the dummy gate 116 is removed, an opening 119 is formed between the spacers 122. In some embodiments, the opening 119 is a trench.

As shown in FIG. 1B, in some embodiments, after the dummy gate 116 is removed, the gate dielectric layer 114 remains. Alternatively, in some other embodiments (not shown), the gate dielectric layer 114 serves as a dummy gate dielectric layer and is removed in a subsequent process.

Figure 1C:
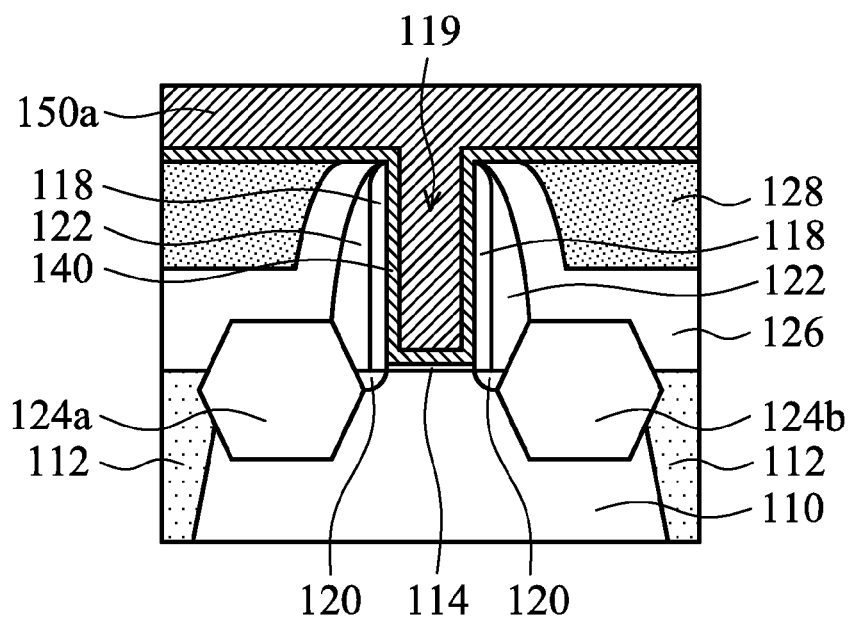

As shown in FIG. 1C, a work function metal layer 140 is deposited over the dielectric layer 128 and the gate dielectric layer 114 in the opening 119, in accordance with some embodiments. The work function metal layer 140 provides the desired work function for transistors to enhance device performance including improved threshold voltage.

In the embodiments of forming an NMOS transistor, the work function metal layer 140 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 140 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or a combination thereof.

In some embodiments, the work function metal layer 140 is made of hafnium, zirconium, titanium, tantalum, aluminum, metal carbides (e.g., hafnium carbide, or zirconium carbide), aluminides, ruthenium or a combination thereof. In some embodiments, the work function metal layer 140 is deposited by using a PVD process, CVD process, ALD process, plating process, another suitable method, or a combination thereof.

A gate electrode layer 150a (also called a metal gate electrode layer) is deposited over the semiconductor substrate 110 and the work function metal layer 140 to fill the opening 119, in accordance with some embodiments. The gate electrode layer 150a is made of a suitable metal material, such as aluminum, tungsten, gold, platinum, cobalt, another suitable metal, an alloy thereof, or a combination thereof, in accordance with some embodiments. The gate electrode layer 150a is deposited using a PVD process, a CVD process, a plating process, another suitable deposition process, or a combination thereof.

Figure 1D:
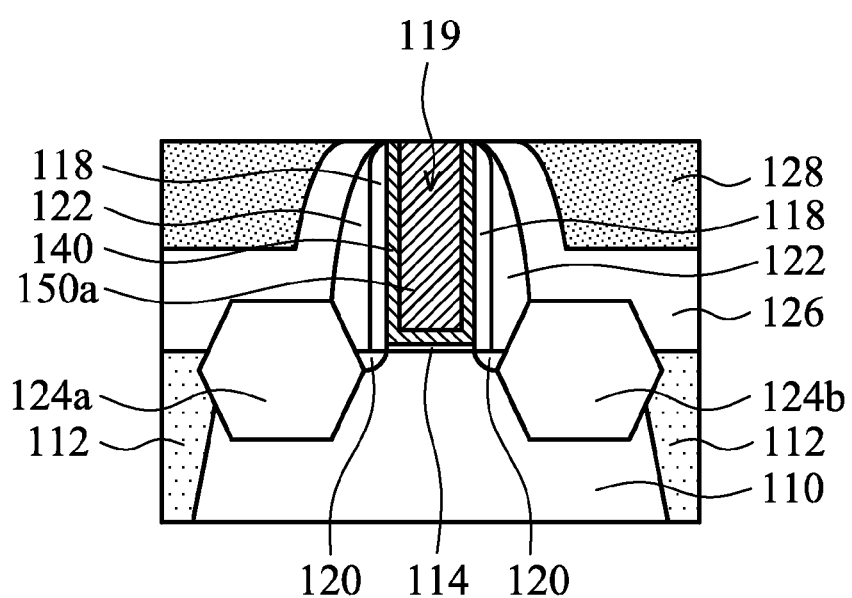

Afterwards, as shown in FIG. 1D, a planarization process is performed to remove the gate electrode layer 150a and the work function metal layer 140 outside of the opening 119, in accordance with some embodiments. The planarization process includes, for example, a chemical mechanical polishing (CMP) process or the like.

Figure 1E:
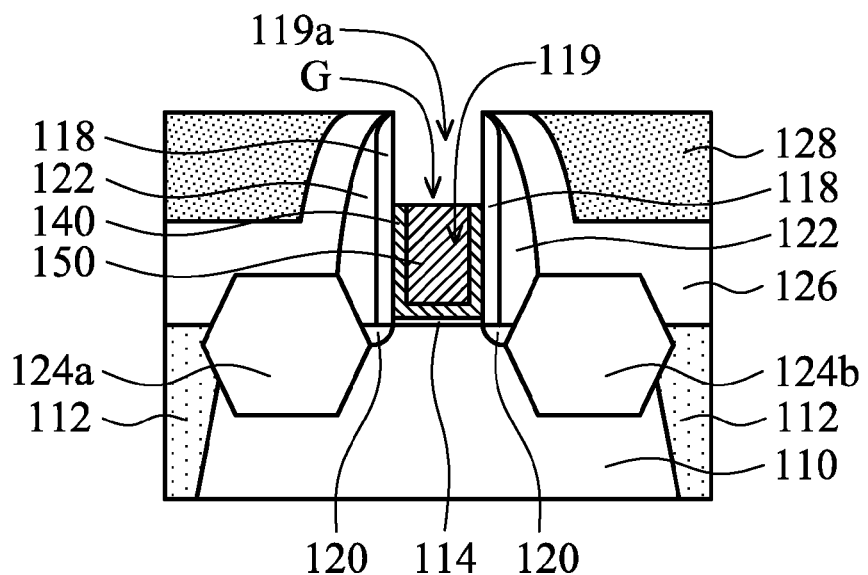

Thereafter, as shown in FIG. 1E, a portion of the gate electrode layer 150a and a portion of the work function metal layer 140 in the opening 119 are removed, in accordance with some embodiments. The removal process includes, for example, an etching process. The gate electrode layer 150a remaining in the opening 119 forms a metal gate 150.

The metal gate 150, the gate dielectric layer 114, and the work function metal layer 140 together form a gate stack G, in accordance with some embodiments. After the removal process, a recess 119a is formed. The recess 119a is surrounded by the spacers 122 and the gate stack G, in accordance with some embodiments.

Figure 1F:
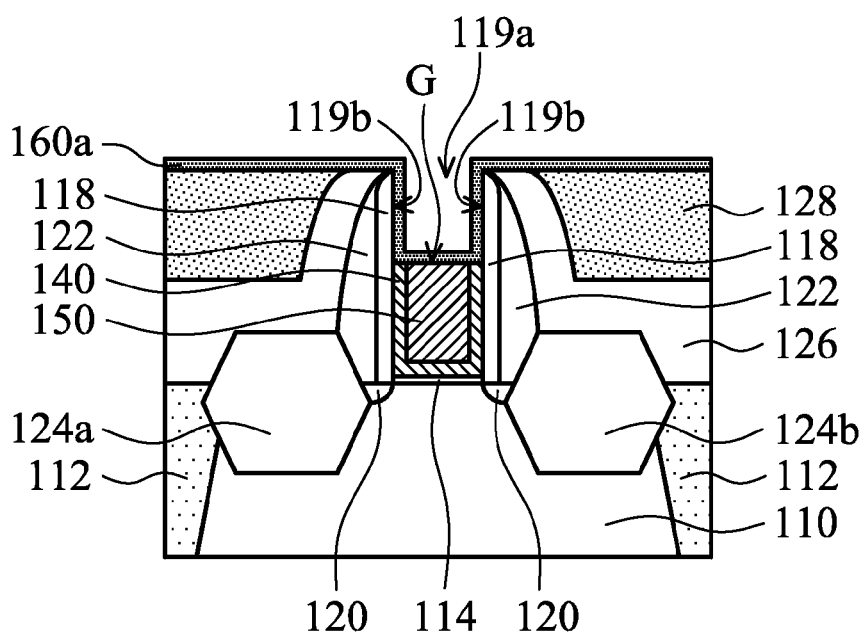

Afterwards, as shown in FIG. 1F, a first insulating material layer 160a is deposited over the dielectric layer 128, the contact etch stop layer 126, the gate stack G, and inner walls 119b of the recess 119a, in accordance with some embodiments. The first insulating material layer 160a includes an insulating material. The first insulating material layer 160a includes an oxide material (e.g., silicon oxide) or another suitable insulating material. In some embodiments, the materials of the first insulating material layer 160a and the spacers 122 are different.

The first insulating material layer 160a is deposited using a non-plasma deposition process, in accordance with some embodiments. The non-plasma deposition process includes a chemical vapor deposition process, such as a thermal chemical vapor deposition process, in accordance with some embodiments. In some other embodiments, the non-plasma deposition process includes a physical vapor deposition process or another suitable deposition process.

Figure 1G:
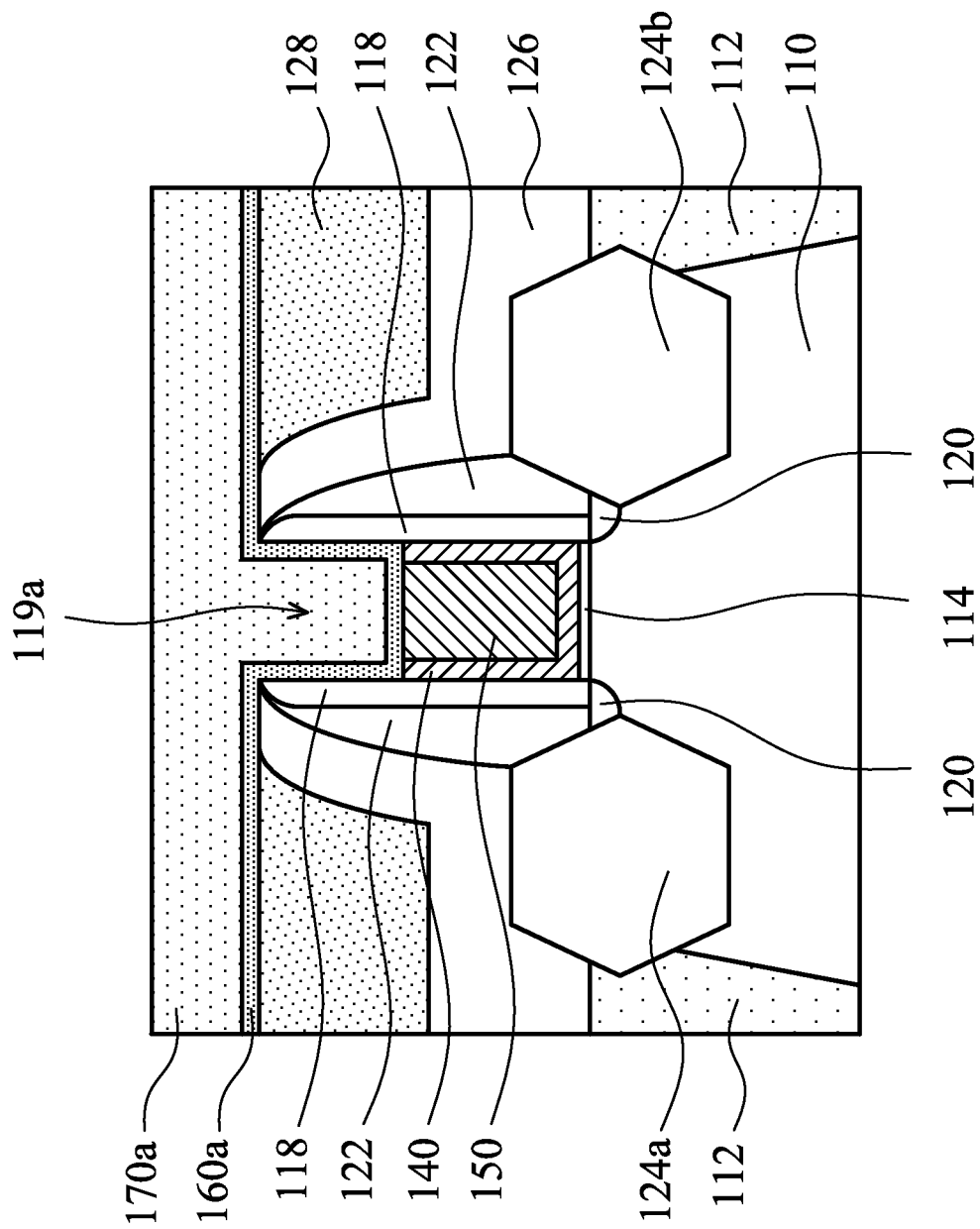

As shown in FIG. 1G, a second insulating material layer 170a is deposited over the first insulating material layer 160a, in accordance with some embodiments. In some embodiments, the materials of the first insulating material layer 160a and the second insulating material layer 170a are different. The second insulating material layer 170a includes silicon nitride or silicon carbide, in accordance with some embodiments.

The second insulating material layer 170a is deposited using a plasma deposition process, in accordance with some embodiments. The plasma deposition process includes a high-density plasma (HDP) deposition process, in accordance with some embodiments. The high-density plasma (HDP) deposition process has a high gap-fill ability. The semiconductor substrate 110 is biased with a bias RF signal during the high-density plasma deposition process, in accordance with some embodiments. The bias RF power of the bias RF signal ranges from about 300 W to about 1000 W, in accordance with some embodiments.

It should be noted that since the first insulating material layer 160a is deposited using a non-plasma deposition process, the first insulating material layer 160a serves as a protective layer to protect layers thereunder from damage (e.g., plasma bombardment damage or plasma charging damage) during the plasma deposition process for forming the second insulating material layer 170a, in accordance with some embodiments. Therefore, the yield of the semiconductor device structure formed with the first insulating material layer 160a is improved.

As shown in FIG. 1H, portions of the first insulating material layer 160a and the second insulating material layer 170a outside of the recess 119a are removed, in accordance with some embodiments. The removal process includes a chemical mechanical polishing process, in accordance with some embodiments. After the removal process, the first insulating material layer 160a remaining in the recess 119a forms a first insulating layer 160, and the second insulating material layer 170a remaining in the recess 119a forms a second insulating layer 170, in accordance with some embodiments.

The first insulating layer 160 separates the second insulating layer 170 from the gate stack G and the spacers 122, in accordance with some embodiments. The first insulating layer 160 surrounds the second insulating layer 170, in accordance with some embodiments. The second insulating layer 170 has a bottom surface 174 and sidewalls 176, in accordance with some embodiments.

The first insulating layer 160 covers the bottom surface 174 and the sidewalls 176, in accordance with some embodiments. The first insulating layer 160 is in direct contact with the bottom surface 174 and the sidewalls 176, in accordance with some embodiments. The first insulating layer 160 conformally covers the bottom surface 174 and the sidewalls 176, in accordance with some embodiments.

The first insulating layer 160 has a top surface 162 facing away from the semiconductor substrate 110, in accordance with some embodiments. The second insulating layer 170 has a top surface 172 facing away from the semiconductor substrate 110, in accordance with some embodiments. The top surface 162 is substantially coplanar with the top surface 172, in accordance with some embodiments.

The dielectric layer 128 surrounding the spacers 122 and the gate stack G has a top surface 128a facing away from the semiconductor substrate 110, in accordance with some embodiments. The top surface 162 is substantially coplanar with the top surfaces 172 and 128a, in accordance with some embodiments. The contact etch stop layer 126 has a top surface 126a facing away from the semiconductor substrate 110, in accordance with some embodiments. The top surfaces 162, 172, 126a, and 128a are substantially coplanar with each other, in accordance with some embodiments.

Figure 1I:
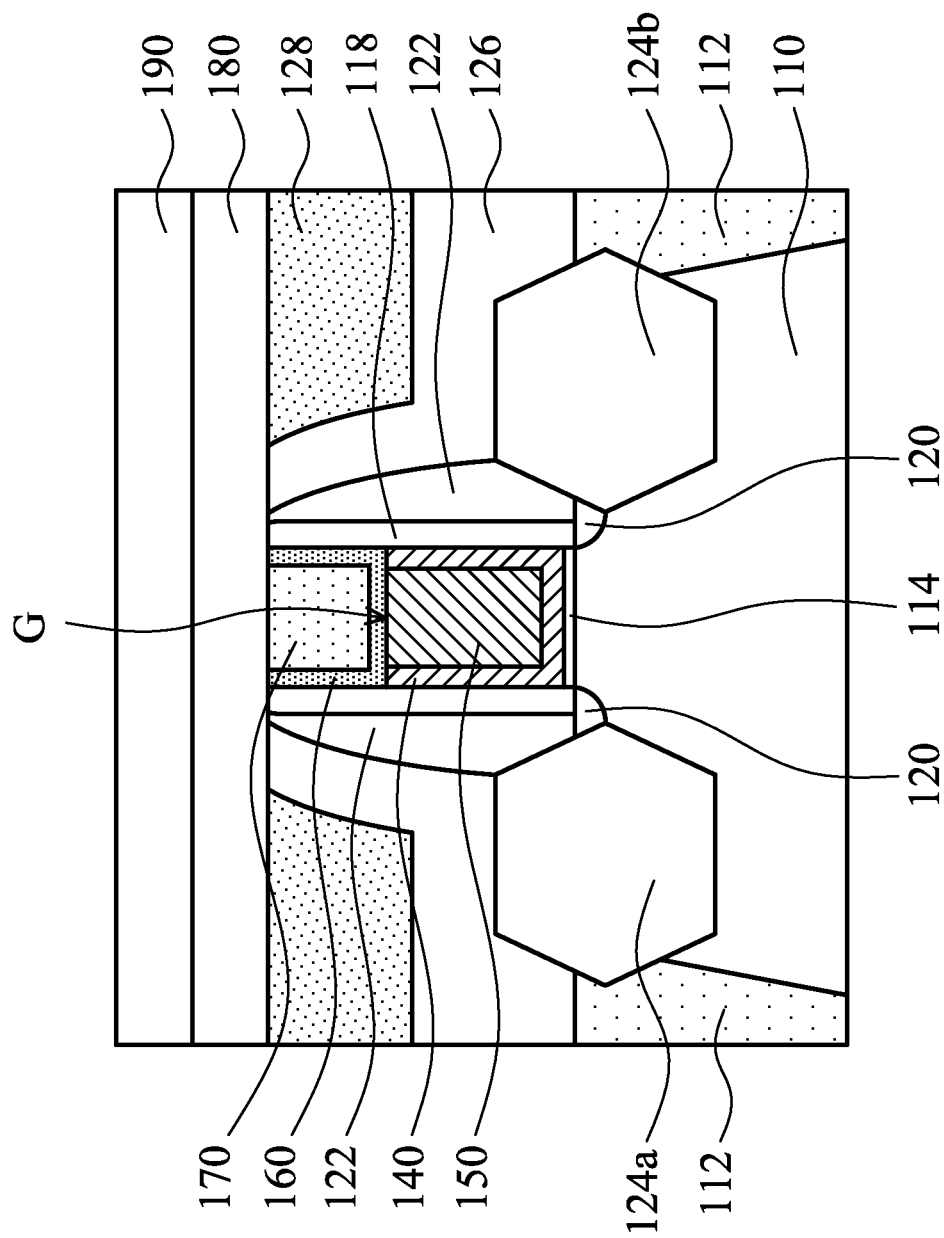

As shown in FIG. 1I, a contact etch stop layer 180 is deposited over the dielectric layer 128, the contact etch stop layer 126, the first insulating layer 160, the second insulating layer 170, and the gate stack G, in accordance with some embodiments. The contact etch stop layer 180 is made of silicon nitride or another suitable material, in accordance with some embodiments.

As shown in FIG. 1I, a protective layer 190 is formed over the contact etch stop layer 180, in accordance with some embodiments. The protective layer 190 is configured to protect the contact etch stop layer 180 from being damaged during a subsequent pre-amorphized implantation (PAI) process, in accordance with some embodiments. The protective layer 190 includes, for example, a plasma-enhanced oxide (PEOX) layer.

Figure 1J:
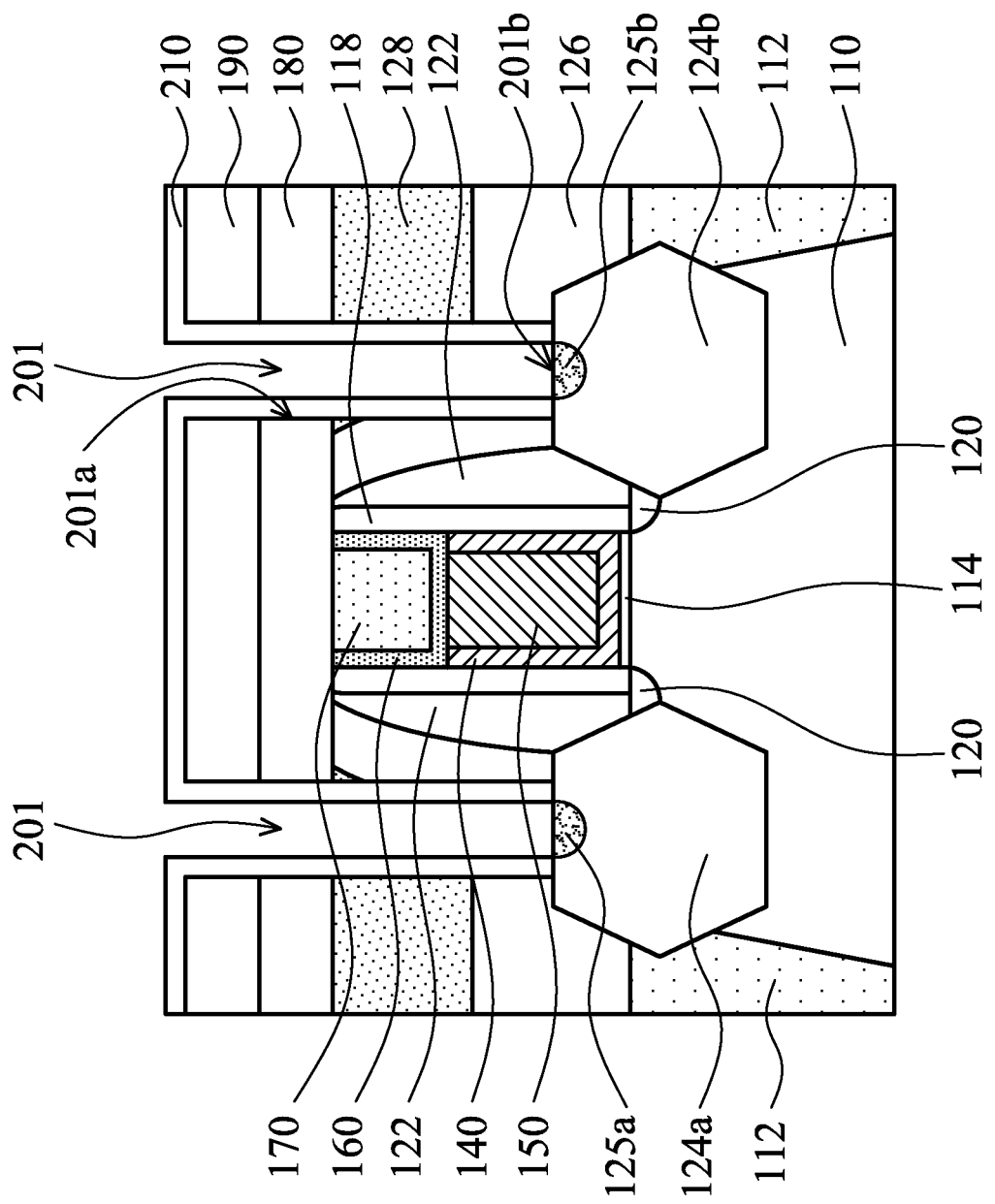

Afterwards, as shown in FIG. 1J, the protective layer 190, the contact etch stop layer 180, the dielectric layer 128 and the contact etch stop layer 126 are patterned to form contact openings 201, in accordance with some embodiments. The contact openings 201 expose the source stressor region 124a and the drain stressor region 124b, respectively. In some embodiments, a photolithography process and an etching process are used for patterning.

Thereafter, a dielectric spacer liner (DSL) layer 210 is conformally formed on the protective layer 190 and the sidewalls 201a of the contact openings 201, in accordance with some embodiments. The DSL layer 210 is configured to protect the sidewalls 201a from being damaged by a subsequent process, such as a pre-amorphized implantation (PAI) process. The DSL layer 210 is made of, for example, SiOC or another suitable material. The DSL layer 210 is formed by, for example, an atomic layer deposition process or another suitable process.

In some embodiments, a pre-amorphized implantation (PAI) process is performed to reduce the dopant channeling effect and enhance dopant activation. In some embodiments, silicon, germanium or carbon is used. In some other embodiments, inert gases, such as neon, argon, krypton, xenon, and/or radon, are used. Portions of the source stressor region 124a and the drain stressor region 124b, exposed and located at the bottoms 201b of the contact openings 201, are turned into an amorphous state as a result of the PAI process.

As shown in FIG. 1J, a salicidation (self-aligned silicidation) process is performed to form metal silicide regions 125a and 125b on/in the source stressor region 124a and the drain stressor region 124b, respectively, in accordance with some embodiments. The metal silicide regions 125a and 125b are made of nickel silicide.

In some embodiments, the metal silicide regions 125a and 125b are made of a silicide material of a suitable metal material. The suitable metal material may include cobalt (Co), nickel (Ni), platinum (Pt), titanium (Ti), ytterbium (Yb), molybdenum (Mo), erbium (Er), or a combination thereof. In some embodiments, the salicidation process is optional.

Figure 1K:
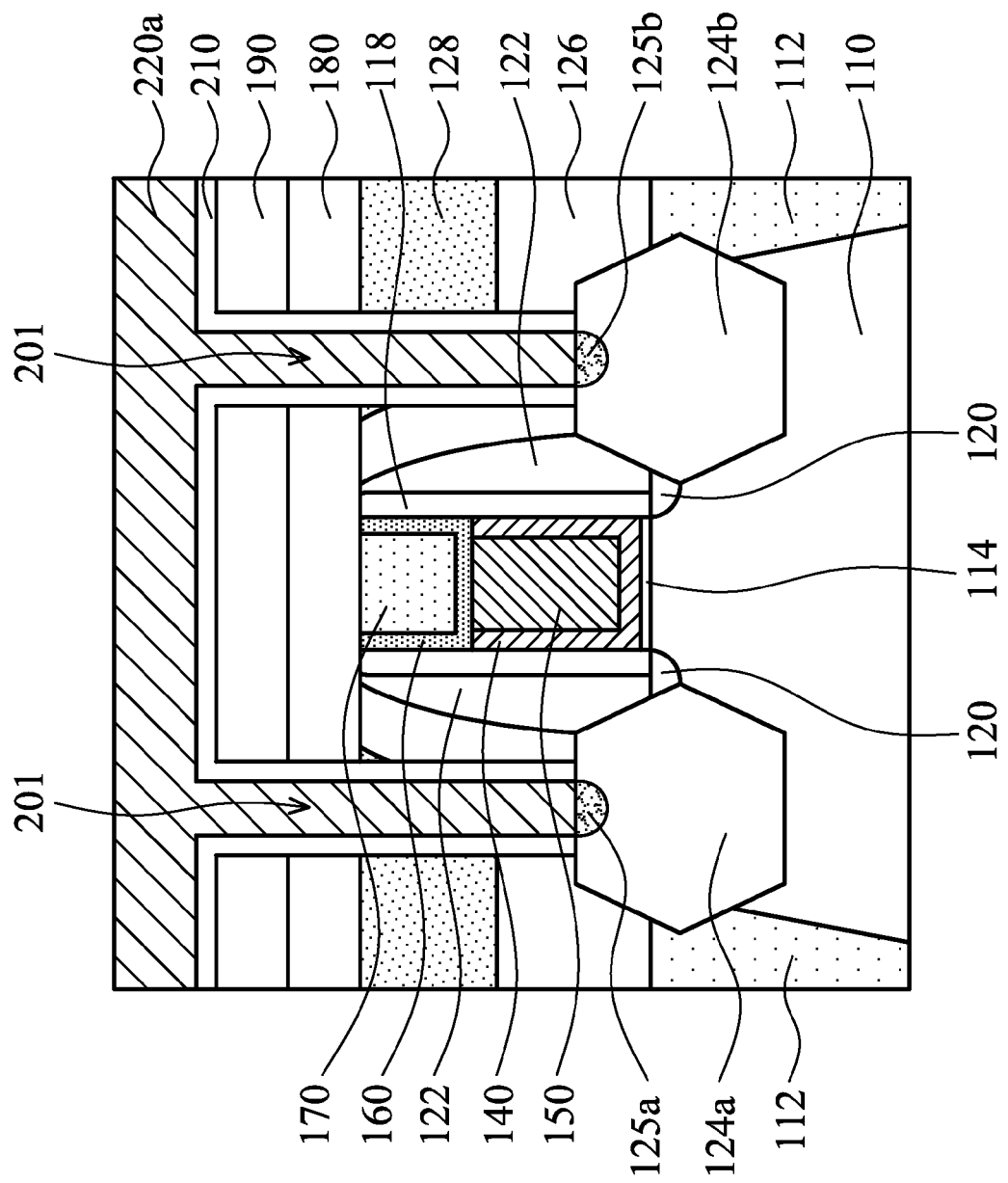

As shown in FIG. 1K, a conductive layer 220a is deposited over the protective layer 190 to fill the contact openings 201, in accordance with some embodiments. The conductive layer 220a connects to the metal silicide regions 125a and 125b. The conductive layer 220a is made of, for example, tungsten or another suitable conductive material. The conductive layer 220a is formed by, for example, a PVD process, a plating process, a CVD process or another suitable process.

Figure 1L:
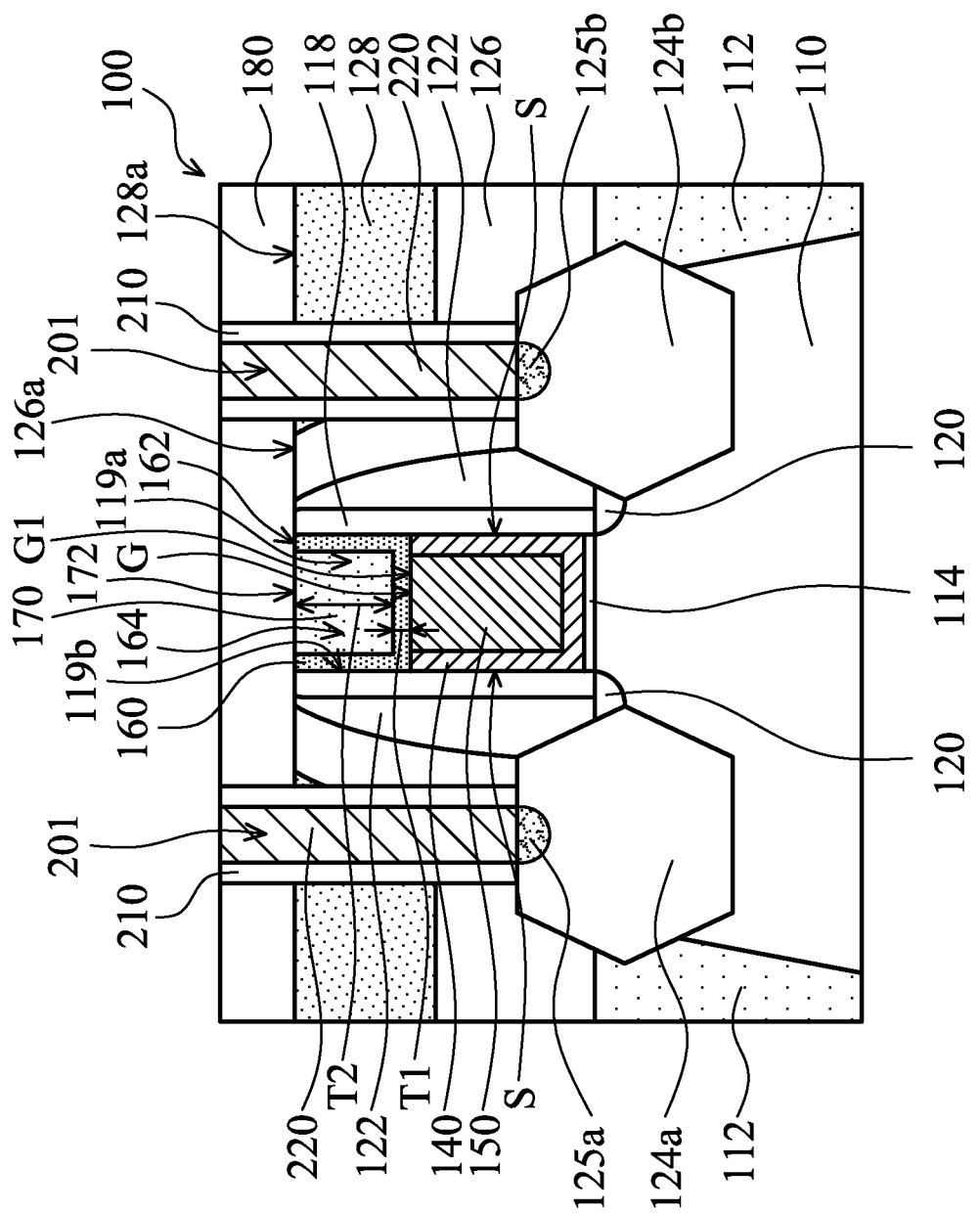

As shown in FIG. 1L, the conductive layer 220a and the DSL layer 210 outside the contact openings 201 and the protective layer 190 are removed, in accordance with some embodiments. The removal process includes, for example, a chemical mechanical polishing (CMP) process. After the removal process, the conductive layer 220a remaining in the contact openings 201 forms contact plugs 220. The contact plugs 220 are electrically connected to the source stressor region 124a and the drain stressor region 124b (i.e. the S/D regions).

As shown in FIG. 1L, a semiconductor device structure 100 is substantially formed. The semiconductor device structure 100 may be an n-type metal-oxide-semiconductor field-effect transistor (MOSFET) or a p-type MOSFET.

In the semiconductor device structure 100, the spacers 122 are over opposite sidewalls S of the gate stack G, in accordance with some embodiments. The spacers 122 and the gate stack G surround the recess 119a over the gate stack G, in accordance with some embodiments. The first insulating layer 160 is over the gate stack G and the inner walls 119b of the recess 119a, in accordance with some embodiments.

In some embodiments, a thickness T1 of the first insulating layer 160 is less than a thickness T2 of the second insulating layer 170. In some embodiments, a ratio of the thickness T2 to the thickness T1 ranges from about 8 to about 18. The thickness T1 ranges from about 80 Å to about 120 Å, in accordance with some embodiments. The thickness T2 ranges from about 1000 Å to about 1400 Å, in accordance with some embodiments.

The first insulating layer 160 conformally covers a top surface G1 of the gate stack G and the inner walls 119b of the recess 119a, in accordance with some embodiments. The first insulating layer 160 has a recess 164 in the recess 119a, in accordance with some embodiments. The recess 164 fills up with the second insulating layer 170, in accordance with some embodiments.

In accordance with some embodiments, semiconductor device structures and methods for forming the same are provided. A first insulating layer formed using a non-plasma deposition process and a second insulating layer formed using a plasma deposition process are sequentially formed in a recess surrounded by a gate stack and spacers to fill up the recess. The first insulating layer serves as a protective layer to protect layers thereunder from damage (e.g., plasma bombardment damage or plasma charging damage) during the plasma deposition process for forming the second insulating layer. Therefore, the yield of the semiconductor device structure formed with the first insulating layer is improved.

In accordance with some embodiments, a semiconductor device structure is provided. The semiconductor device structure includes a semiconductor substrate. The semiconductor device structure includes a gate stack over the semiconductor substrate. The semiconductor device structure includes spacers over opposite sidewalls of the gate stack. The spacers and the gate stack surround a recess over the gate stack. The semiconductor device structure includes a first insulating layer over the gate stack and an inner wall of the recess. The semiconductor device structure includes a second insulating layer over the first insulating layer. Materials of the first insulating layer and the second insulating layer are different, and a first thickness of the first insulating layer is less than a second thickness of the second insulating layer.

In accordance with some embodiments, a semiconductor device structure is provided. The semiconductor device structure includes a semiconductor substrate. The semiconductor device structure includes a gate stack over the semiconductor substrate. The semiconductor device structure includes spacers over opposite sidewalls of the gate stack. The spacers and the gate stack surround a recess over the gate stack. The semiconductor device structure includes a first insulating layer in the recess. The semiconductor device structure includes a second insulating layer over the first insulating layer. The materials of the first insulating layer and the second insulating layer are different, and the first insulating layer separates the second insulating layer from the gate stack and the spacers.

In accordance with some embodiments, a method for forming a semiconductor device structure is provided. The method includes forming two separated spacers over a semiconductor substrate. The method includes forming a gate stack between the spacers. The spacers and the gate stack surround a recess. The method includes forming a first insulating layer in the recess and over the gate stack and an inner wall of the recess. The method includes forming a second insulating layer in the recess and over the first insulating layer. The materials of the first insulating layer and the second insulating layer are different, and the first thickness of the first insulating layer is less than the second thickness of the second insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a gate stack over the semiconductor substrate, wherein the gate stack comprises a gate dielectric layer and a metal gate;
   spacers over opposite sidewalls of the gate stack, wherein the spacers and the gate stack surround a recess over the gate stack;
   a first insulating layer over the gate stack and an inner wall of the recess, wherein the first insulating layer is in direct contact with a top surface of the gate stack;
   a second insulating layer over the first insulating layer, wherein materials of the first insulating layer and the second insulating layer are different, and a first thickness of the first insulating layer is less than a second thickness of the second insulating layer; and
   a dielectric layer over the semiconductor substrate and surrounding the gate stack, the spacers, the first insulating layer, and the second insulating layer, wherein the dielectric layer and the first insulating layer are made of a same material.

2. The semiconductor device structure as claimed in claim 1, wherein the first insulating layer conformally covers the top surface of the gate stack and the inner wall of the recess.

3. The semiconductor device structure as claimed in claim 1, wherein the first insulating layer has a second recess in the first recess.

4. The semiconductor device structure as claimed in claim 3, wherein the second recess is filled up with the second insulating layer, and the first insulating layer is in direct contact with the second insulating layer.

5. The semiconductor device structure as claimed in claim 4, wherein a first top surface of the first insulating layer is substantially coplanar with a second top surface of the second insulating layer.

6. The semiconductor device structure as claimed in claim 1, wherein a ratio of the second thickness to the first thickness ranges from about 8 to about 18.

7. The semiconductor device structure as claimed in claim 1, wherein the first insulating layer and the dielectric layer are made of silicon oxide.

8. The semiconductor device structure as claimed in claim 1, wherein the second insulating layer comprises silicon nitride or silicon carbide.

9. A semiconductor device structure, comprising:
   a semiconductor substrate;
   a gate stack over the semiconductor substrate, wherein the gate stack comprises a gate dielectric layer and a metal gate;
   spacers over opposite sidewalls of the gate stack, wherein the spacers and the gate stack surround a recess over the gate stack;
   a first insulating layer in the recess, wherein the first insulating layer is in direct contact with a top surface of the gate stack; and
   a second insulating layer over the first insulating layer, wherein materials of the first insulating layer and the second insulating layer are different, the first insulating layer separates the second insulating layer from the gate stack and the spacers, and the first insulating layer surrounds the second insulating layer; and
   a dielectric layer over the semiconductor substrate and surrounding the gate stack, the spacers, the first insulating layer, and the second insulating layer, wherein the dielectric layer and the first insulating layer are made of a same material.

10. The semiconductor device structure as claimed in claim 9, wherein the first insulating layer and the dielectric layer are made of silicon oxide.

11. The semiconductor device structure as claimed in claim 9, wherein the second insulating layer has a bottom surface and a sidewall, and the first insulating layer covers the bottom surface and the sidewall of the second insulating layer.

12. The semiconductor device structure as claimed in claim 11, wherein the first insulating layer is in direct contact with the bottom surface and the sidewall of the second insulating layer.

13. The semiconductor device structure as claimed in claim 11, wherein the first insulating layer conformally covers the bottom surface and the sidewall of the second insulating layer.

14. The semiconductor device structure as claimed in claim 9, wherein a first top surface of the first insulating layer is substantially coplanar with a second top surface of the second insulating layer and a third top surface of the dielectric layer.

15. The semiconductor device structure as claimed in claim 9, wherein a ratio of a first thickness of the second insulating layer to a second thickness of the first insulating layer ranges from about 8 to about 18.

16. A method for forming a semiconductor device structure, comprising:
   forming two spacers over a semiconductor substrate;
   forming a dielectric layer over the semiconductor substrate and surrounding the spacers;

forming a gate stack between the spacers, wherein the spacers and the gate stack surround a recess, and the gate stack comprises a gate dielectric layer;

forming a first insulating layer in the recess and over the gate stack and an inner wall of the recess by a non-plasma deposition process, wherein the first insulating layer is in direct contact with a top surface of the gate stack, and the dielectric layer and the first insulating layer are made of a same material; and forming a second insulating layer in the recess and over the first insulating layer by a plasma deposition process, wherein materials of the first insulating layer and the second insulating layer are different, and a first thickness of the first insulating layer is less than a second thickness of the second insulating layer.

17. The method for forming a semiconductor device structure as claimed in claim 16, wherein the formation of the first insulating layer and the second insulating layer comprises:

performing the non-plasma deposition process to form a first insulating material layer over the gate stack and the inner wall of the recess;

performing the plasma deposition process to form a second insulating material layer over the first insulating material layer; and removing portions of the first insulating material layer and the second insulating material layer outside of the recess.

18. The method for forming a semiconductor device structure as claimed in claim 17, wherein the non-plasma deposition process comprises a chemical vapor deposition process, and the first insulating layer and the dielectric layer are made of silicon oxide.

19. The method for forming a semiconductor device structure as claimed in claim 16, wherein the plasma deposition process comprises a high-density plasma deposition process.

20. The method for forming a semiconductor device structure as claimed in claim 16, wherein a top surface of the gate dielectric layer is between the semiconductor substrate and a bottom surface of the first insulating layer.

* * * * *